(12) United States Patent
Nielsen et al.

(10) Patent No.: US 7,626,827 B2
(45) Date of Patent: Dec. 1, 2009

(54) HIGH DENSITY IN-PACKAGE MICROELECTRONIC AMPLIFIER

(75) Inventors: Henrik K. Nielsen, San Jose, CA (US); Dan G. Georgesco, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 12/204,927

(22) Filed: Sep. 5, 2008

(65) Prior Publication Data

US 2009/0067137 A1   Mar. 12, 2009

Related U.S. Application Data

(60) Provisional application No. 60/970,579, filed on Sep. 7, 2007.

(51) Int. Cl.
*H05K 7/02* (2006.01)
(52) U.S. Cl. .................. 361/761; 361/728; 361/763; 174/260
(58) Field of Classification Search ......... 361/760–763, 361/728; 174/260
See application file for complete search history.

(56) References Cited

U.S. PATENT DOCUMENTS

| | | | | |
|---|---|---|---|---|
| 5,641,944 A | * | 6/1997 | Wieloch et al. | 174/252 |
| 5,670,749 A | * | 9/1997 | Wieloch et al. | 174/260 |
| 5,869,896 A | * | 2/1999 | Baker et al. | 257/724 |
| 5,874,848 A | * | 2/1999 | Drafts et al. | 327/511 |
| 5,945,605 A | * | 8/1999 | Julian et al. | 73/727 |
| 6,333,856 B1 | * | 12/2001 | Harju | 361/761 |
| 6,401,545 B1 | * | 6/2002 | Monk et al. | 73/756 |
| 6,401,847 B1 | * | 6/2002 | Lykken | 180/9.1 |
| 6,891,239 B2 | * | 5/2005 | Anderson et al. | 257/414 |
| 7,005,993 B2 | * | 2/2006 | Webb et al. | 340/601 |
| 2002/0167063 A1 | * | 11/2002 | Fujimoto et al. | 257/435 |
| 2005/0104003 A1 | | 5/2005 | Jarron | |
| 2006/0139896 A1 | * | 6/2006 | Bambridge et al. | 361/753 |
| 2007/0190687 A1 | | 8/2007 | Chen et al. | |
| 2008/0128838 A1 | | 6/2008 | Theuss | |

* cited by examiner

*Primary Examiner*—Dameon E Levi
(74) *Attorney, Agent, or Firm*—Luedeka, Neely & Graham, P.C.

(57) ABSTRACT

A sensor module having a package substrate, a sensor disposed within and electrically connected to the package substrate, an amplifier disposed within and electrically connected to the package substrate, and electrical traces within the package substrate for routing sensor signals from the sensor to the amplifier, and then from the amplifier to external electrical connectors on the package substrate.

20 Claims, 1 Drawing Sheet

HIGH DENSITY IN-PACKAGE MICROELECTRONIC AMPLIFIER

This application claims all rights and priority on U.S. provisional patent application Ser. No. 60/970,579 filed Sep. 7, 2007. This invention relates to the field of integrated circuits. More particularly, this invention relates to the arrangement of integrated circuits on printed circuit boards.

FIELD

Background

Solid state sensors are used in a great number of important applications. The sensors 18 as depicted in FIG. 1 are typically disposed within a sensor module 12 that is mounted to a printed circuit board 14. Typically the signals that are produced by the sensor 18 are sufficiently weak, that some sort of amplification is needed in order to make productive use of the signals. Thus, designs usually include banks of amplifiers 16 that are also mounted on the printed circuit board 14, such as around the sensor module 12, as depicted.

Unfortunately, a relatively large amount of signal noise typically exists in these prior art sensor designs. In addition, due to the number of channels in most sensor modules 12, it is no longer possible to place the amplifiers 16 close enough to the sensor module 12.

What is needed, therefore, is a system that overcomes problems such as these, at least in part.

SUMMARY

The above and other needs are met by a sensor module having a package substrate, a sensor disposed within and electrically connected to the package substrate, an amplifier disposed within and electrically connected to the package substrate, and electrical traces within the package substrate for routing sensor signals from the sensor to the amplifier, and then from the amplifier to external electrical connectors on the package substrate.

By placing the amplifier in the sensor module in this manner, instead of on the printed circuit board outside of the sensor module, the pin capacitance that degrades the noise performance and reduces the electronic bandwidth in prior art designs is eliminated.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
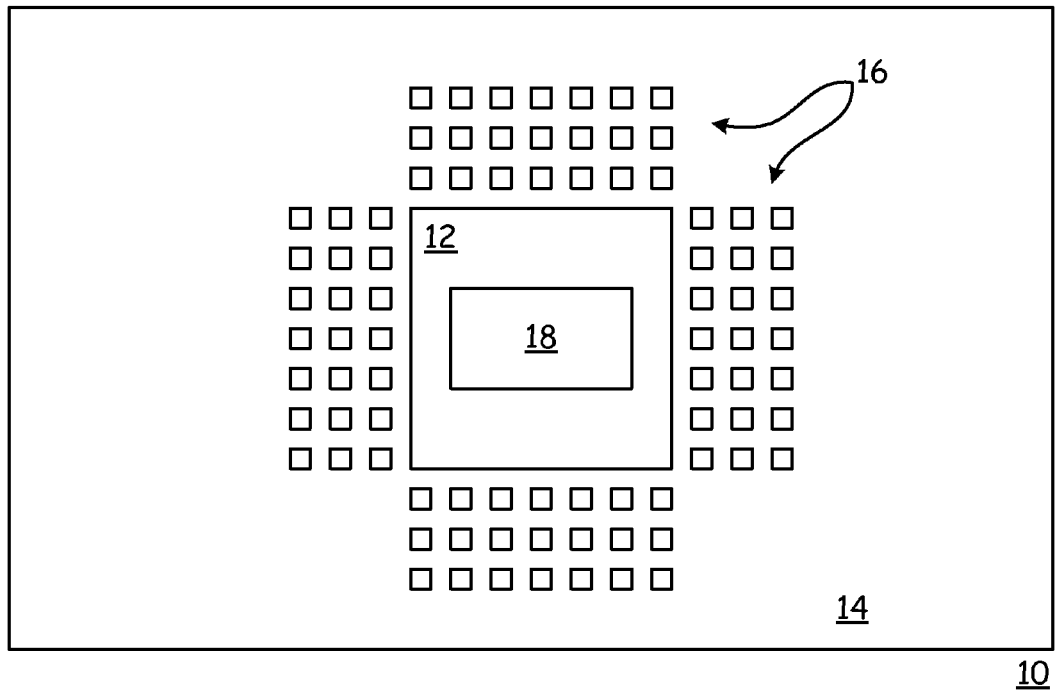
FIG. 1 is a top plan view of a prior art sensor module and amplifiers mounted on a printed circuit board.
Figure 2:
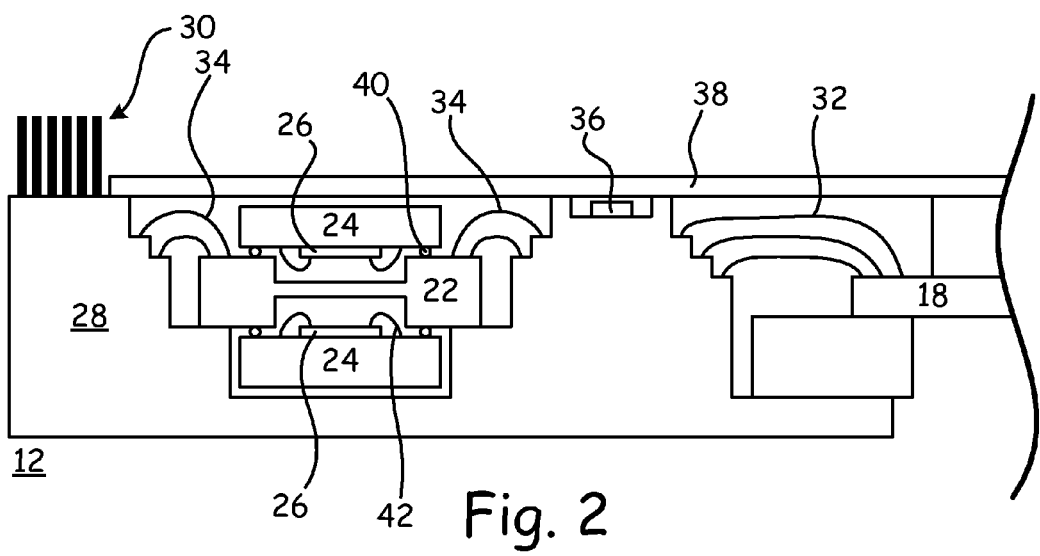
FIG. 2 is a cross-sectional side view of a sensor module according to an embodiment of the invention.

With reference now to FIG. 2, there is depicted a cross-sectional side view of a sensor module 12 according to an embodiment of the invention. The sensor module 12 in the embodiment depicted has pins 30 for making electrical connections to a printed circuit board 14. However, it is appreciated that the electrical connections and package type could be accomplished in some other manner, such as ball bonding or surface mount. The sensor module 12 as depicted in FIG. 2 is a partial view that is cut on the right hand side. It is appreciated that the elements of the sensor module 12 as generally described herein are representative only, and are not by way of limitation. The package substrate 28 can be either a ceramic or built-up substrate.

The sensor 18 makes electrical contacts with the package substrate 28, such as through wire bonds 32. It is appreciated that other connection types could also be used. In some embodiments a buffer capacitor 36 is employed between the sensor 18 and the other active elements disposed within the sensor module 12. Wire bonds 34 make electrical connections between the package substrate 28 and an amplifier assembly 22. Solder bumps 40 make electrical connections between the amplifier assembly 22 and the amplifier modules 24. Wire bonds 42 make electrical connections between the amplifier modules 24 and the amplifier chips 26. Again, it is appreciated that any of these electrical connections could be formed by other means as known in the art. The components mounted within the package substrate 28 are enclosed within the substrate 28 such as by a lid 38.

The signals from the sensor 18, such as analog signals, are preferably routed to the amplifiers 26 prior to exiting the sensor module through the pins 30 to the printed circuit board 14. In this manner, the signals from the sensor 18 are amplified before they have very far to travel. A multitude of amplifier chips 26, modules 24, and assemblies 22 can be disposed within the package substrate 28, so that all of the amplification that is needed for one or more sensor 18 can be provided within the sensor module 12. In some embodiments the amplifier chips 26 have a fixed gain of about two.

Fabricating the sensor module 12 in this manner provides a number of benefits. For one, signal loss is greatly reduced, because of the many fewer electrical connections, such as pin, bumps, etc., and shorter distances that exist between the sensor 18 and the amplifiers 26. Thus, so-called sensor noise is decreased. This design tends to eliminate about two-thirds of the load capacitance due to the pin connections 30 alone. This design also lowers the output impedance from 300 ohms to 50 ohms.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:
1. A sensor module comprising:
   a package substrate formed of layers of material and having a first surface with an open cavity,
   a sensor disposed within the cavity, the sensor for providing signals,
   first electrical traces disposed between the layers of the package substrate, the first electrical traces for receiving the signals from the sensor,
   an amplifier disposed within the cavity for receiving the signals from the first electrical traces and providing amplified signals to second electrical traces disposed between the layers of the package substrate, electrical connections disposed on the surface of the package substrate for receiving the buffered signals from the second electrical traces, and a lid disposed on the first surface of the package substrate for covering at least the buffer and the amplifier.

2. The sensor module of claim 1, further comprising a buffer capacitor disposed within the cavity for buffering the sensor.

3. The sensor module of claim 1, wherein the electrical connections comprise at least one of pins, pads, and solder balls.

4. The sensor module of claim 1, wherein the package substrate is formed of ceramic.

5. The sensor module of claim 1, wherein the sensor is electrically connected to the first electrical traces through wire bonds.

6. The sensor module of claim 1, wherein the sensor is electrically connected to the first electrical traces through bump bonds.

7. The sensor module of claim 1, wherein the amplifier is electrically connected to the first electrical traces and the second electrical traces through wire bonds.

8. The sensor module of claim 1, wherein the amplifier is electrically connected to the first electrical traces and the second electrical traces through bump bonds.

9. The sensor module of claim 1, wherein the amplifier comprises an amplifier assembly having multiple amplifiers disposed on a substrate.

10. The sensor module of claim 1, wherein the amplifier has a fixed gain of about two.

11. The sensor module of claim 1, wherein the amplifier, the buffer, and the sensor are disposed within separate cavities in the first surface of the substrate.

12. The sensor module of claim 1, wherein the sensor is disposed in a portion of the cavity that is also open through an opposing second side of the substrate.

13. A sensor module comprising:

a package substrate formed of layers of material and having a first surface with an open cavity, a sensor disposed within the cavity, the sensor for providing signals, first electrical traces disposed between the layers of the package substrate, the first electrical traces for receiving the signals from the sensor, an amplifier assembly disposed within the cavity for receiving the signals from the first electrical traces and providing amplified signals to second electrical traces disposed between the layers of the package substrate, the amplifier assembly comprising a substrate for receiving the signals from the first electrical traces, providing the signals to amplifiers mounted on the substrate, and for receiving the amplified signals from the amplifiers, electrical connections disposed on the surface of the package substrate for receiving the buffered signals from the second electrical traces, and a lid disposed on the first surface of the package substrate for covering at least the buffer and the amplifier assembly.

14. The sensor module of claim 13, further comprising a buffer capacitor disposed within the cavity for buffering the sensor.

15. The sensor module of claim 13, wherein the sensor is electrically connected to the first electrical traces through wire bonds.

16. The sensor module of claim 13, wherein the amplifier assembly is electrically connected to the first electrical traces and the second electrical traces through wire bonds.

17. The sensor module of claim 13, wherein the amplifier assembly, the buffer, and the sensor are disposed within separate cavities in the first surface of the substrate.

18. The sensor module of claim 13, wherein the sensor is disposed in a portion of the cavity that is also open through an opposing second side of the substrate.

19. A sensor module comprising:

a package substrate formed of layers of material and having a first surface, a sensor disposed within a first cavity in the first surface, the sensor for providing signals, a buffer capacitor disposed within a second cavity in the first surface for buffering the sensor, first electrical traces disposed between the layers of the package substrate, the first electrical traces for receiving the signals from the sensor, an amplifier assembly disposed within a third cavity in the first surface for receiving the signals from the first electrical traces and providing amplified signals to second electrical traces disposed between the layers of the package substrate, the amplifier assembly comprising a substrate for receiving the signals from the first electrical traces, providing the signals to amplifiers mounted on the substrate, and for receiving the amplified signals from the amplifiers, electrical connections disposed on the first surface of the package substrate for receiving the buffered signals from the second electrical traces, and a lid disposed on the first surface of the package substrate for covering at least the second cavity and the third cavity.

20. The sensor module of claim 19, wherein the first cavity is also open through an opposing second side of the substrate.

* * * * *